(12) United States Patent
Nakada et al.

(10) Patent No.: US 7,481,888 B2
(45) Date of Patent: Jan. 27, 2009

(54) HEAT TREATMENT JIG AND HEAT TREATMENT METHOD FOR SILICON WAFER

(75) Inventors: Yoshinobu Nakada, Ageo (JP); Hiroyuki Shiraki, Ichikawa (JP); Takeshi Hasegawa, Yonezawa (JP)

(73) Assignee: Sumco Corporation, Tokyo (JP)

( * ) Notice: Subject to any disclaimer, the term of this patent is extended or adjusted under 35 U.S.C. 154(b) by 332 days.

(21) Appl. No.: 10/551,695

(22) PCT Filed: Mar. 30, 2004

(86) PCT No.: PCT/JP2004/004508

§ 371 (c)(1),
(2), (4) Date: Sep. 30, 2005

(87) PCT Pub. No.: WO2004/088744

PCT Pub. Date: Oct. 14, 2004

(65) Prior Publication Data

US 2006/0208434 A1 Sep. 21, 2006

(30) Foreign Application Priority Data

Mar. 31, 2003 (JP) ............................. 2003-097365

(51) Int. Cl.
*C23C 16/00* (2006.01)
(52) U.S. Cl. ...................................... 118/725; 118/728
(58) Field of Classification Search ............... 118/725, 118/728
See application file for complete search history.

(56) References Cited

U.S. PATENT DOCUMENTS 5,310,339 A * 5/1994 Ushikawa .................... 432/253
5,492,229 A   2/1996 Tanaka
5,779,797 A   7/1998 Kitano

FOREIGN PATENT DOCUMENTS

| JP | 06-168902   |   | 6/1994 |
|----|-------------|---|--------|
| JP | 07-058039   |   | 3/1995 |
| JP | 08073296 A  | * | 3/1996 |
| JP | 2001-168175 |   | 6/2001 |
| JP | 2002-134593 |   | 5/2002 |
| JP | 2002-170865 |   | 6/2002 |
| JP | 2003-521109 |   | 7/2003 |

* cited by examiner

*Primary Examiner*—Shamim Ahmed
(74) *Attorney, Agent, or Firm*—Pillsbury, Winthrop, Shan Pittman, LLP

(57) ABSTRACT

In this heat treatment jig and method for silicon wafers, a silicon wafer is heat-treated while being mounted on support projections provided on three support arms, having an intervening spacing, protruding from a support frame towards the center. At that time, all the support projections under the silicon wafer are positioned on a same circle within a region where a radial distance from the center is defined by 85 to 99.5% of the wafer radius, and the support arms form an angle of 120° with each other about the center. With this jig and method, free depth of a dislocation generated from a pin position can be controlled deeper than a device formation region, and a widest slip-free region where the surface is free from slip dislocation is obtained.

2 Claims, 7 Drawing Sheets

HEAT TREATMENT JIG AND HEAT TREATMENT METHOD FOR SILICON WAFER

CROSS REFERENCE TO RELATED APPLICATIONS

This is the U.S. National Phase of PCT/JP2004/004508, filed Mar. 30, 2004, which the contents of claims priority to Japanese Patent Application No. 2003-97365, filed on Mar. 31, 2003, both of which are incorporated herein in their entirety by reference.

TECHNICAL FIELD

The present invention relates to heat treatment jig for a wafer and heat treatment method for a wafer, specifically relates to a technology suitably used in RTA or the like.

BACKGROUND ART

Conventionally, a rapid thermal annealer (RTA) is well known as a heat treatment apparatus for rapid heating and rapid cooling of a silicon wafer. As described in FIG. 3(a) of Patent Reference 1, a ring-shaped wafer holder 100 is mounted within a furnace of the rapid thermal annealer in order to maintain a horizontal orientation of the wafer.

As shown in Patent Reference 2, in another well known type of wafer holder, a wafer is supported by a plurality of points.

However, in the heat treatment of wafers horizontally supported during the treatment, there has been a problem of yield reduction caused by generation of slip dislocations. It is considered that, since supported portions of the wafer are pressed by their own weight, sliding friction between the wafer and the projections is caused by warping of the wafer during the heat treatment or by a difference in heat expansion, strain occurs in a portion of concentrated weight, and therefore each portion supported by support projections generates slip dislocations.

In conventional wafer holders, reduction of slip dislocation is devised. An art of Patent Reference 2 is directed to reducing slip dislocation caused by the presence of an orientation flat.

For reduction of slip dislocations in a wafer lacking an orientation flat, Non Patent Reference 1 describes that, regarding support positions of the wafer by a wafer holder having a plurality of support points, the support points are preferably positioned at a region where a radial distance from a center is defined by 80 to 85% of the wafer radius.

Patent Reference 1: Japanese Unexamined Patent Application, First Publication No. 2002-134593.
Patent Reference 2: Japanese Unexamined Patent Application, First Publication No. 2002-170865.
Non Patent Reference 1: Takeda, R. et al. J. Electrochem. Soc., Vol. 144, No. 10, October (1997), pp. L280-L282.

However, even a wafer lacking an orientation flat generates slips when the wafer is mounted on a wafer holder of a rapid thermal apparatus and heated rapidly under a furnace temperature of not less than 1000° C. There is still further demand for a greater reduction of such dislocations.

DISCLOSURE OF THE INVENTION

Based on the above considerations the invention aims to provide a heat treatment jig and heat treatment method for wafers, by which free depth of dislocation generated from the pin points is maintained deeper than a device formation region, and a widest slip-free region is obtained on the wafer surface.

A heat treatment method for a silicon wafer of the invention is a heat treatment method for a silicon wafer in a heat treatment furnace. In this method, the above described problem was overcome by supporting a wafer at three support positions within a region where a radial distance from a center is defined by 85 to 99.5% of the wafer radius.

A heat treatment method for a silicon wafer of the invention is a heat treatment method using a three-points supporting device having: three support arms protruding from a support frame towards a center so as to form an intervening spacing with each other; and support projections projecting upwards from each support arm, on which a silicon wafer is mounted and heat-treated in a heat treatment furnace.

When all the support projections are positioned around a same circle under the wafer, all the support projections are positioned within a region where a radial distance from the center is defined by 85 to 99.5% of the wafer radius, and the support arms are arranged so as to form an angle of 120° with each other about the center point. By this method, the above described problem was overcome.

A heat treatment jig of the invention is provided with a support frame; three support arms, protruding from the support frame towards the center so as to form an intervening spacing with each other; and support projections projecting upwards from each support arm. The support arms are arranged so as to form an angle of 120° with each other about the center. Positions of all the support projections can be preset so that they are positioned around a same circle about the center point, within a region where a radial distance from the center is defined by 85 to 99.5% of the wafer radius. With this jig, the above described problem was solved.

In the invention, it is preferable that the support projections are fixed on the support arm so that the fixed position may be preset.

A wafer of the invention may be heat-treated by the above described heat treatment method for a wafer.

In a heat treatment method of the invention, by setting the support points to form an angle of 120° about the center and to be positioned within a region where a radial distance from the center is defined by 85 to 99.5% of the wafer radius, it is possible to control lengths of slip dislocations grown from the reverse surface of the wafer caused by contact with the support projections, so that the dislocation lengths are short enough not to affect a device formation region of the wafer surface.

By this method, generation of slip dislocations in the device formation region is reduced and a reduction in wafer yield can be prevented.

When the support projections are positioned so that their radial distances from the center are smaller than 85% of the wafer radius, contact defects occurring in the inner portion of the wafer being used by device makers to manufacture a substrate cause a reduction in yields. In the case of a type having three support arms protruding from the support frame towards the center intervening spacing, elongated arm lengths result in difficulties in maintaining a horizontal state, and after being used for a long time, further difficulties in maintaining a horizontal state are caused by the progression of arm deformation. This state is not preferable, because an unbalanced in-plane load enlarges slips at a specific support projection. When the support projections are positioned so that their radial distances from the center are greater than 99.5% of the wafer radius, in the wafer mounting process, unsatisfactory mounting of the wafer sometimes occurs because of a lack of margin. It is not preferable to support a wafer at its edge because slips generated at the edge easily cause cracking of the wafer.

When a center angle formed by the support projections on the same circumference is set other than 120°, spacing angles of the support projections different from 120° cause an unbalanced load at each projection. A large load at a specific support point causes a long length of slip dislocation occasionally penetrating the wafer to the surface. When the supporting spacing is greater than 120°, there is a possibility that the wafer will drop in the direction of a large spacing between support positions. Therefore, this state is not preferable.

In the heat treatment jig of the invention, support projections are provided on the upside of three support arms comprised of a first, a second, and a third arm protruding towards a center intervening spacing from the support frame so that the arms forming an angle of 120° with each other. The positions of the support projections can be preset so that each projection is positioned in the same circle about the center, within a region where a radial distance from the center is defined by 85 to 99.5% of the wafer radius. Accordingly, all the supporting positions of a silicon wafer form an angle of 120° about the center and are positioned within a region where a radial distance from the center is defined by 85 to 99.5% of the wafer radius, thereby lengths of slip dislocations caused by contacts with support projections can be controlled to sufficiently short lengths that do not affect the device formation region of the wafer surface.

In the invention, by enabling presetting of the fixing position of the support projection on the support arm and fixing the projection to that position, the support position of the wafer can be preset in accordance with the diameter, thickness, hardness/stress properties, thermal properties or the like of the wafer so that the length of slip dislocations caused by contact with the support projections can be controlled to sufficiently short lengths that do not affect the device formation region of the surface of the silicon wafer.

As a practical construction, for example, it is possible to fit the support projections at fixing holes provided at predetermined positions on the support arms.

BEST MODE FOR CARRYING OUT THE INVENTION

An embodiment of a heat treatment jig for a silicon wafer and a heat treatment method for a silicon wafer according to the invention is explained below with reference to the drawings.

Figure 1:
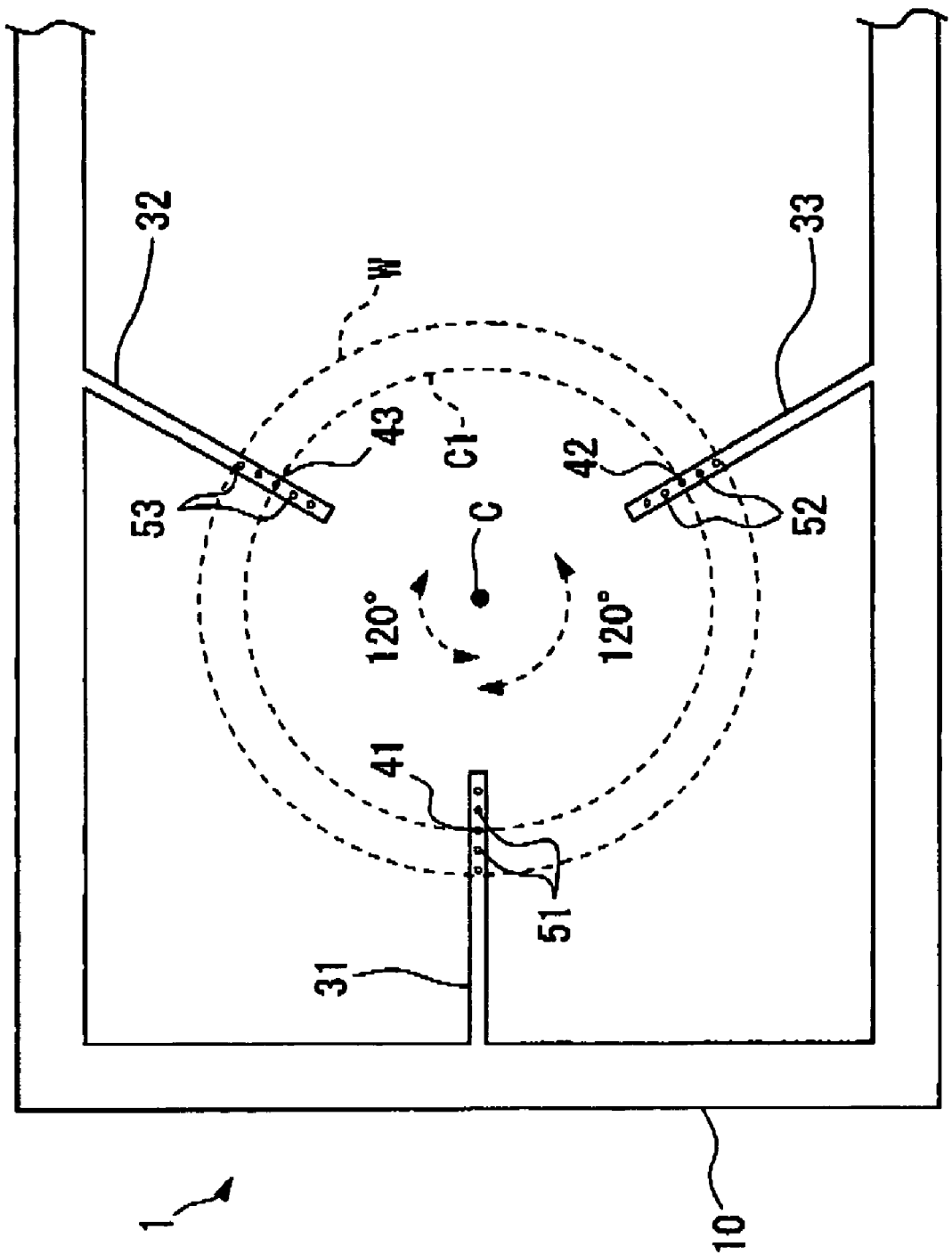
FIG. 1 is a plan view of an embodiment of a heat treatment jig for a silicon wafer of the invention.
Figure 2:
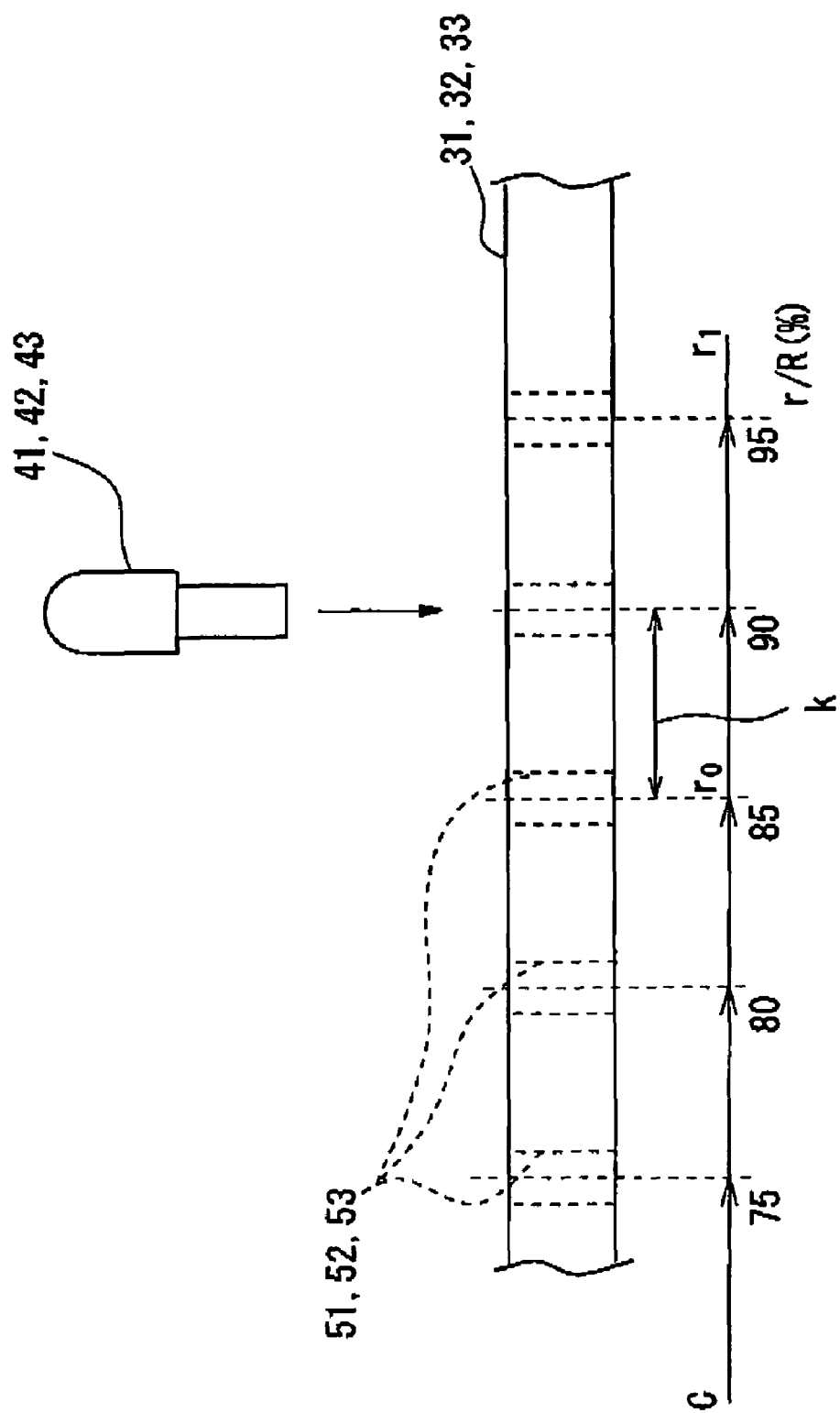
FIG. 2 is an enlarged side view illustrating support arms shown in FIG. 1

FIG. 1 is a plan view illustrating a heat treatment jig for a silicon wafer in the embodiment. A side view of a support arm in the embodiment is illustrated in FIG. 2. Positional relationships between the support projections and the silicon wafer in the embodiment are shown in a schematic plan view in FIG. 3.

In the drawings, numeral 1 indicates the heat treatment jig for a silicon wafer, and 10 indicates a support frame.

Firstly, this embodiment can be applied to a silicon wafer of 150 to 400 mm in diameter, preferably 200 to 300 mm in diameter and lacking an orientation flat.

As shown in FIGS. 1 and 2, a heat treatment jig 1 of the embodiment has: a support frame 10 comprising approximately rectangular sides forming, in plan view, a rectangle-like shape one side of which is open; a first support arm 31 provided at a side opposite to the opening of the support frame 10; and a second and a third support arm 32, 33 provided at the other sides of the support frame 10.

Each of the first, second and third support arms 31, 32, 33 is formed integrally with the support frame. The support frame 10, and support arms 31, 32, 33 are formed from silica or SiC, or from SiC, a surface of which is coated with polycrystalline silicon. Among these, silica is a preferable material because it is heat resistant and is impracticable as a source of contamination.

The support arms 31, 32, and 33 are placed in the same plane shared by the support frame 10, and each arm protrudes from the support frame 10 inwardly towards a center point C located at a near center position of the support frame 10. The support arms 31, 32, and 33 are provided so as to form an angle of 120° with each other about the center point C. That is, the second and the third support arms 32 and 33 are provided form, at their basal ends, an angle of 120° (60°) with sides of the support frame 10.

Support projections 41, 42, and 43 are respectively provided to the upper sides of the support arms 31, 32, and 33. A position of each support projections 41, 42, and 43 can be preset on the same circle C1 about the center point C, and its outer radial position can be preset in the region ranging from 85 to 99.5% of a radius R of a wafer W.

Figure 3:
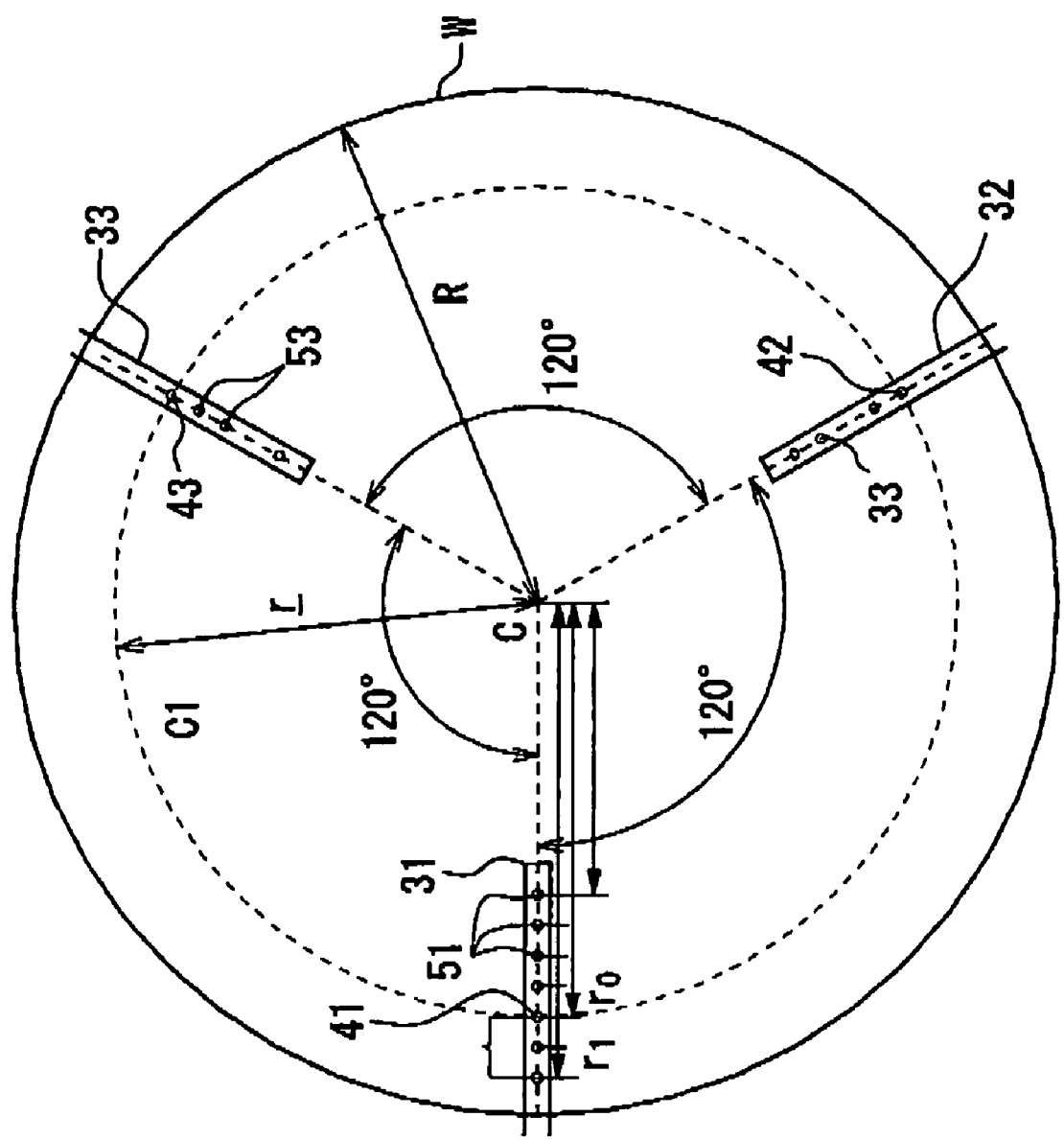
FIG. 3 is a schematic plan view of an embodiment of the heat treatment method and heat treatment jig for a silicon wafer of the invention.

Here, the meaning of position of the support projections 41, 42, 43 being in the region where a radial distance from the center is defined by 85 to 99.5% of the wafer radius is as follows. As shown in FIG. 3, a r/R×100 (%) position is defined on a circle having a distance of r from the center C in the silicon wafer W of the radius R. When the r/R×100 value varies within the above described range, the position defined by a range of r from a smaller r0 to a greater r1 corresponds to the above described position.

In the embodiment, as shown in FIG. 2, the support arms 31, 32 and 33 are respectively provided with a plurality of fixing holes 51, 52, and 53, to which the support projections 41, 42, and 43 are fitted, thereby enabling presetting of their fixing positions.

In the support arm 31, a plurality of fixing hole, 51, 51 is provided at a regular interval k. A similar constitution is applied for fixing holes 52, 52 in the support arm 32, and fixing holes 53, 53 in the support arm 33.

The support projection 41, 42, and 43 are formed from silica or SiC or from SiC a surface of which is coated with polycrystalline silicon. Among these, silica is a preferable material because it is heat resistant and is impracticable as a source of contamination.

The support projections 41, 42, and 43 are set to have positions on the same circle C1 about the center point C, where, as shown in FIG. 3, the radius r of the circle C1 is in a region ranging from 85 to 99.5% of the radius R of the wafer W. At that time, a wafer W is mounted so as to be concentric about the center point C.

The interval k of the respective fixing holes 51, 52, and 53 is set to a value near 5% of the r/R value. The drawings also illustrate fixing holes at a position where a radial distance from the center is smaller than 85% of the wafer radius. However, these holes are for a case such as mounting a different size wafer W, and may be eliminated.

When the support projections are positioned so that their radial distances from the center are smaller than 85% of the wafer radius, in the inner portion of the wafer being used by device makers to manufacture a substrate, the occurrence of contact defects causes a reduction in the yield. In the case of a type having three support arms protruding from support frame towards the center forming an intervening spacing with each other, elongated arm lengths results in difficulties in maintaining of horizontal state, and after being used for a long time, further difficulties in maintaining a horizontal state are caused by the progression of arm deformation. This state is not preferable, because an unbalanced in-plane load enlarges slips at a specific support projection. When the support projections are positioned so that their radial distances from the center are greater than 99.5% of the wafer radius, in the wafer mounting process, unsatisfactory mounting of the wafer sometimes occurs because of a lack of a margin. It is not preferable to support a wafer at its edge because slips generated in the edge easily cause cracking of the wafer.

Figure 4:
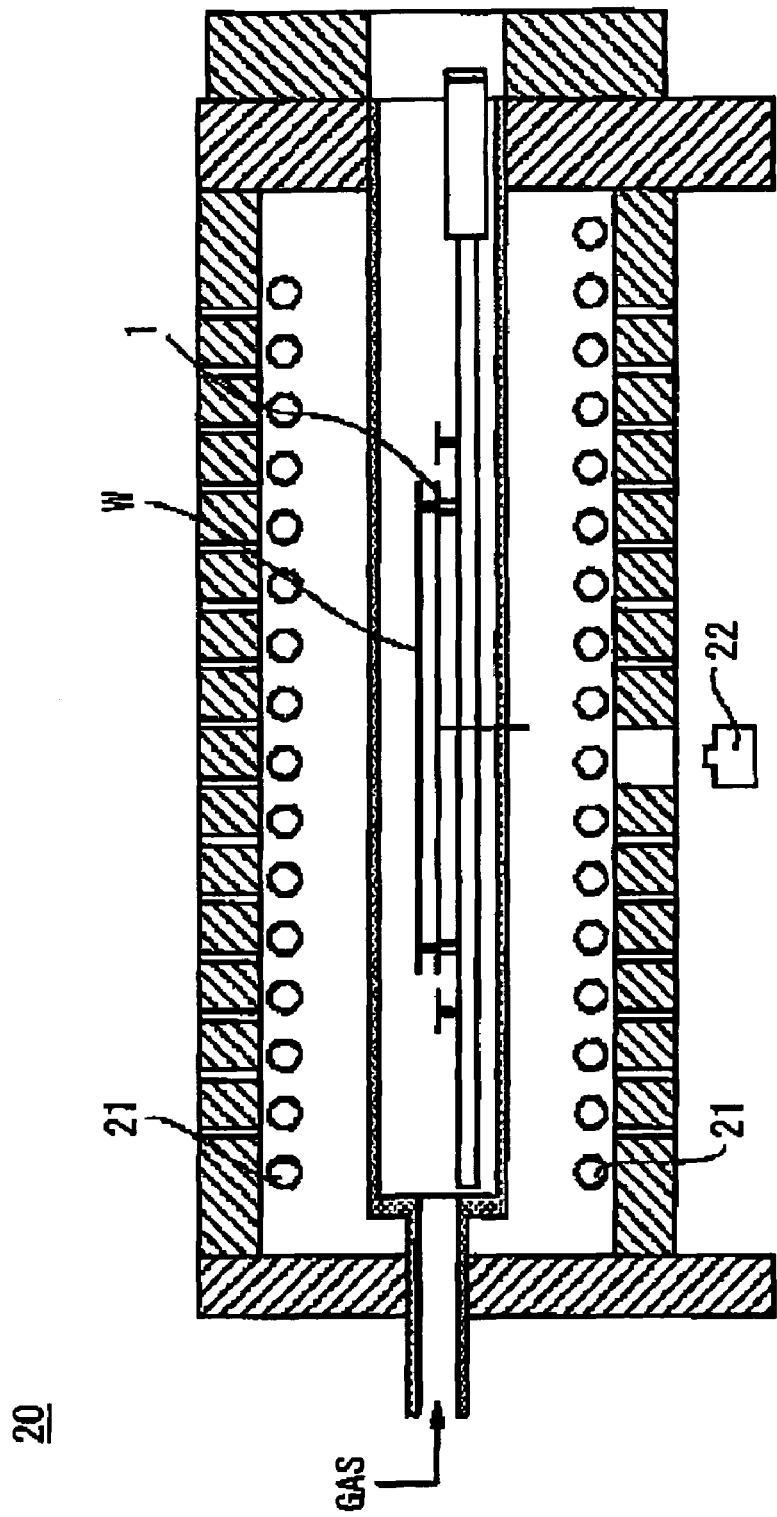
FIG. 4 is a sectional view of a heat treatment furnace.

As shown in FIG. 3 a silicon wafer is mounted on the support projections 41, 42, and 43 of the heat treatment jig 1 of the embodiment on which the support projections 41, 42, and 43 are positioned on the same circle about the center point C of the wafer, thereby the wafer W is supported horizontally on the jig 1. After that, the heat treatment jig 1 for a silicon wafer is transferred into a heat-treatment furnace 20 exemplified in FIG. 4 and the wafer is heat treated. By the above arrangement of the silicon wafer on the heat treatment jig 1, it is possible to reduce the generation of slip dislocation on the wafer surface during heat treatment. Numeral 21 in FIG. 4 indicates a heating lamp, and 22 indicates a pyrometer.

Although a mono-layer type heat treatment furnace was used as the heat treatment furnace in the above embodiment, the invention can be applied to a vertical heat treatment furnace capable of treating a plurality of wafers arranged in a ladder boat or the like.

As a preset interval, fixing positions of the support projections may have a value different from 5% of the r/R value. The positions may be set at a non-regular interval.

EXAMPLE

An example of the invention is explained in the following.

Example 1

Silicon wafers lacking an orientation flat (notch-type silicon wafers) of 200 mm in diameter, 0.725 mm in thickness are prepared.

The support projections 41, 42, 43 shown in FIGS. 1 and 3 are positioned around the same circle of radius r and are concentric with the wafer W about the center C. Where the wafer radius is termed R, the positions are controlled so that the r/R value was varied at every 5% interval, from 65% to 90%, and was 97%. The silicon wafer W was mounted on the support projections with the above described arrangement and was supported horizontally. The heat treatment jig 1 being mounted with the silicon wafer was transferred to the heat treatment furnace 20 shown in FIG. 4, and the wafer W was heat-treated for 10 seconds at a furnace temperature of 1250° C.

Comparative Evaluation

Figure 6:
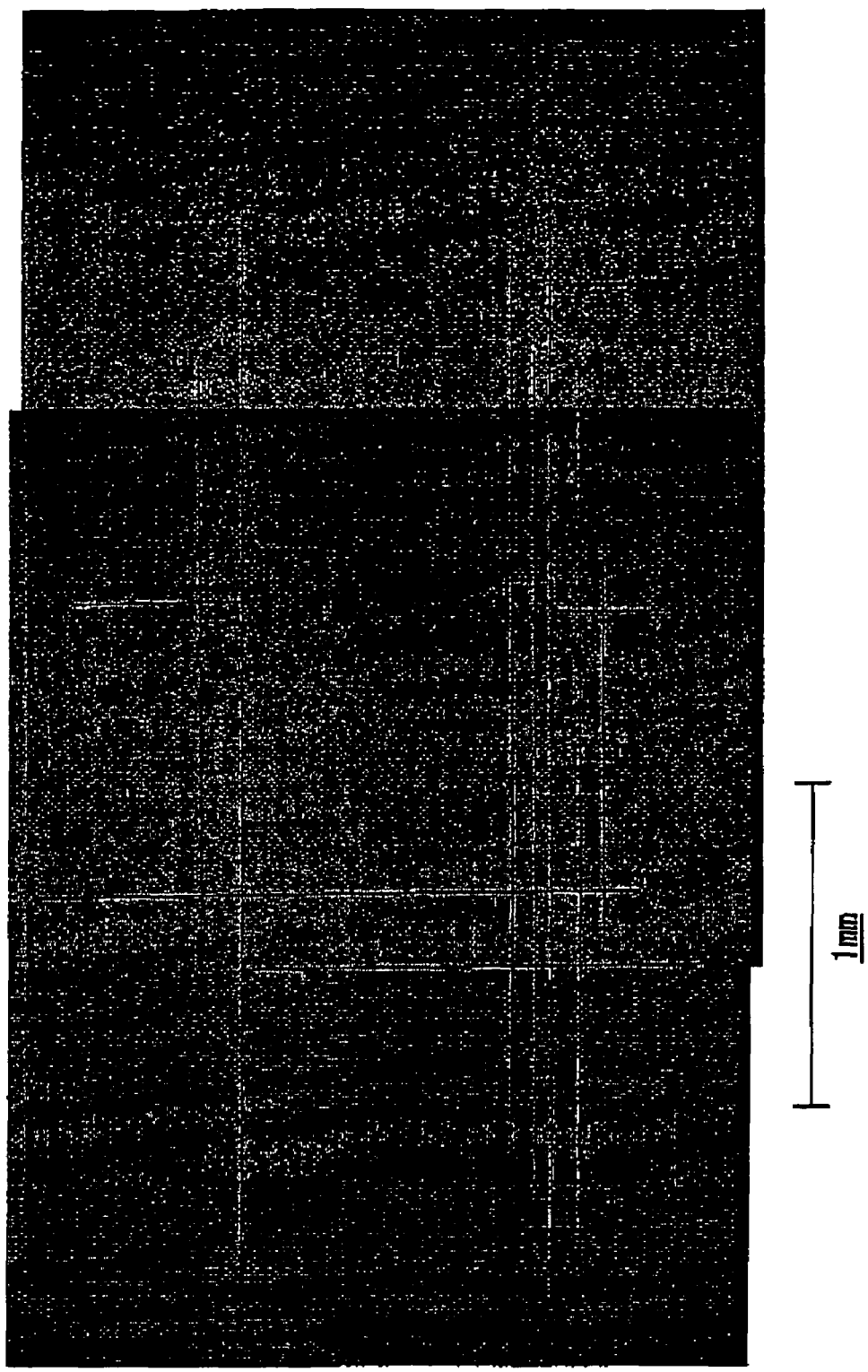
FIG. 6 is an image showing the condition of the wafer surface at the 70% support position in an example of the invention.
Figure 7:
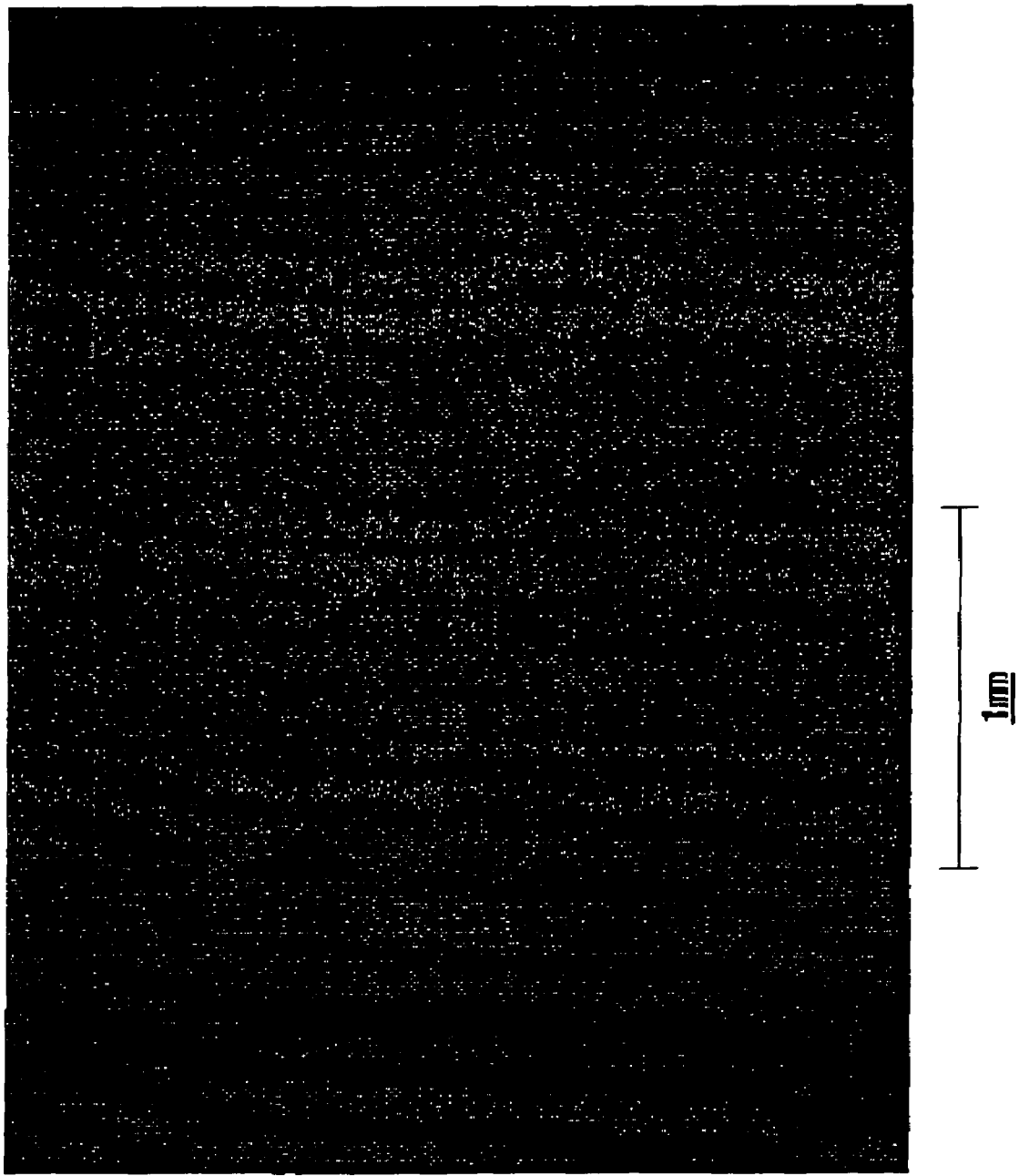
FIG. 7 is an image showing the surface condition of the wafer at the 97% support position in an example of the invention.

After the RTA treatment of the wafer supported by the reverse surface, the silicon wafer was etched with Secco etching liquid, and slip dislocations occurring on a surface as a device formation region were observed. When no dislocation has developed on the surface, an etch pit cannot be observed after the Secco etching. FIGS. 6 and 7 show the results for r/R value of 70%, and 97% respectively.

In FIG. 6, where support projections (pin positions) are at 70% positions, lines on the image are drawn respectively for slips so that each line is drawn between most remote dislocation. Then the length was measured as the slip length.

Figure 5:
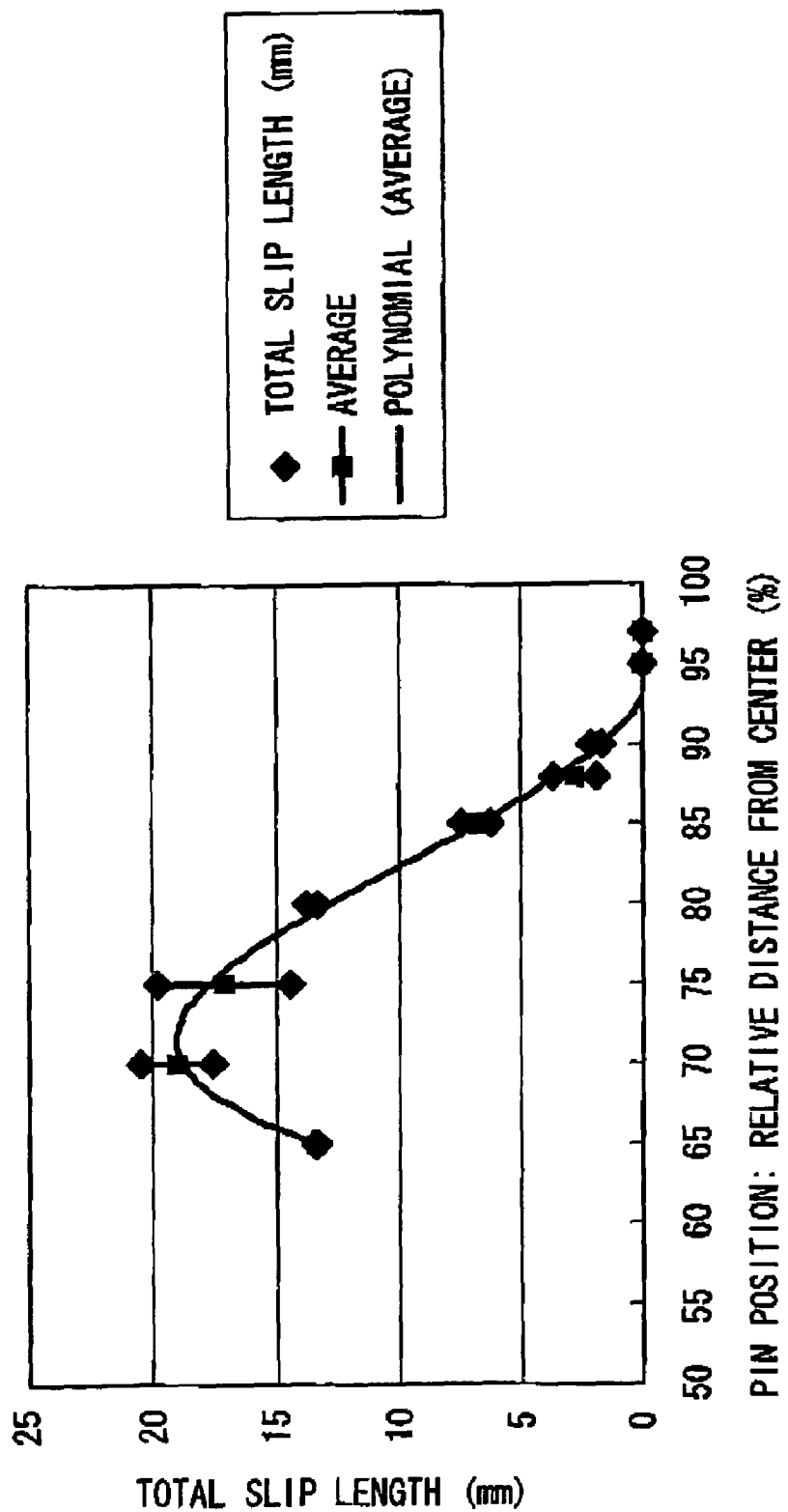
FIG. 5 is a graph showing a relationship between the total slip length and the position of a support projection (pin position) of the invention.

Next, the cumulative length (sum) of the slip length was calculated for each wafer. The results are shown in FIG. 5. The value is an average value of results for the same support projection position (pin position) from a plurality of wafers.

Results

As shown in the results in FIG. 5, when the position of the support projection (pin position) is defined by a value greater than 85% of the wafer radius, the total slip length falls in a range of not more than approximately 7 mm, and production yield of wafers can be enhanced to a level not actually affecting the device formation property.

In particular, as shown in FIG. 7, at a position defined by not less than 95%, preferably around 97%, slip dislocations do not appear on the wafer surface, and specifically well characterized wafers can be produced.

INDUSTRIAL APPLICABILITY

By utilizing the heat treatment method and heat treatment jig for silicon wafers of the invention, all the support positions of the silicon wafer are arranged forming angles of 120° about the center, and are also arranged in a region where a radial distance from the center is defined by 85 to 99.5% of the wafer radius. With this arrangement, the length of slip dislocations caused by contact with the support projection can be suppressed so that the dislocation only grows to a region not affecting the device formation region of the wafer surface. Accordingly, by reducing the generation of slip dislocation in the device formation region, a reduction of wafer yields can be effectively prevented.

The invention claimed is:

1. A heat treatment jig for a silicon wafer, comprising:
   a support frame;
   three support arms protruding from the support frame towards a center so as to form an intervening spacing with each other; and
   support projections projecting upwards from each support arm,
   wherein the support arms are arranged so as to form an angle of 120° with each other about the center, and positions of all the support projections can be preset so that they are positioned around a same circle about the center point, within a region where a radial distance from the center is defined by 85 to 99.5% of the wafer radius.

2. A heat treatment jig of a silicon wafer according to claim 1, wherein the support projections are fixed to the support arms so that fixing positions can be preset.

* * * * *